United States Patent
Kimura (10) Patent No.: US 7,064,512 B2
(45) Date of Patent: Jun. 20, 2006

(54) POSITIONING APPARATUS, EXPOSURE APPARATUS, AND SEMICONDUCTOR DEVICE MANUFACTURING METHOD

(75) Inventor: Atsushi Kimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/105,403

(22) Filed: Apr. 14, 2005

(65) Prior Publication Data

US 2005/0242764 A1    Nov. 3, 2005

(30) Foreign Application Priority Data

Apr. 15, 2004   (JP)   ............................. 2004-120479

(51) Int. Cl.
   *B64C 17/06*   (2006.01)
(52) U.S. Cl. ................. 318/649; 318/567; 318/568.12; 318/568.22; 318/560; 318/574; 414/935; 414/940; 414/941
(58) Field of Classification Search ................ 318/941, 318/560–650; 414/935, 936, 937, 938, 939, 414/940
   See application file for complete search history.

(56) References Cited

U.S. PATENT DOCUMENTS

| 6,475,263 B1 | 11/2002 | McTiernan et al. ............ 75/249 |
| 6,750,625 B1* | 6/2004 | Binnard et al. ............. 318/592 |
| 6,836,315 B1* | 12/2004 | Roes ............................ 355/53 |
| 2002/0170389 A1 | 11/2002 | McTiernan et al. ........... 75/338 |
| 2003/0098965 A1* | 5/2003 | Binnard et al. ................ 355/73 |
| 2003/0128350 A1* | 7/2003 | Tanaka ........................ 355/72 |
| 2003/0218732 A1* | 11/2003 | Watson et al. ................ 355/53 |
| 2004/0027573 A1* | 2/2004 | Takahashi .................... 356/401 |
| 2004/0032575 A1* | 2/2004 | Nishi et al. ................... 355/53 |
| 2004/0051854 A1* | 3/2004 | Tanaka et al. ................ 355/53 |
| 2005/0231141 A1* | 10/2005 | Koide ........................ 318/135 |

FOREIGN PATENT DOCUMENTS

EP   1357434 A1 * 10/2003
JP   2002-339032   11/2002

* cited by examiner

Primary Examiner—Rina Duda
Assistant Examiner—Tyrone Smith
(74) Attorney, Agent, or Firm—Fitzpatrick, Cella, Harper & Scinto (57) ABSTRACT

A positioning apparatus includes an X stage, a linear motor (X-axis) which drives the X stage along the X-axis, a linear motor (Y-axis) which drives a Y stage along the Y-axis, a laser interferometer which detects position information of the stages along the X and Y directions, and a controller which controls the linear motor (X-axis) and linear motor (Y-axis) based on a detection result of the laser interferometer. The controller controls the linear motor (Y-axis) based on the position information of the stages along the X direction detected by the laser interferometer, so as to cancel a force generated along the Y-axis by the linear motor (X-axis) when the linear motor (X-axis) is to drive the stage in the X direction.

2 Claims, 8 Drawing Sheets

FRONT VIEW

FIG. 3B

PLAN VIEW

FIG. 4A

FRONT VIEW

FIG. 4B

PLAN VIEW

POSITIONING APPARATUS, EXPOSURE APPARATUS, AND SEMICONDUCTOR DEVICE MANUFACTURING METHOD

CLAIM OF PRIORITY

This application claims priority from Japanese Patent Application No. 2004-120479 filed on Apr. 15, 2004, which is hereby incorporated by reference herein.

FIELD OF THE INVENTION

The present invention relates to a positioning apparatus, an exposure apparatus using the positioning apparatus, and a semiconductor device manufacturing method.

BACKGROUND OF THE INVENTION

A positioning apparatus for positioning a stage, e.g., a wafer stage or reticle stage, used in an exposure apparatus can drive the stage in X, Y, and X translational directions and a rotational direction such as a pitching or rolling direction (see Japanese Patent Laid-Open No. 2000-339032). Generally, the positioning apparatus can drive the stage along the respective drive axes using hydrostatic bearings or electromagnets. The positioning apparatus detects the stage position using a position measurement device, such as a laser interferometer or linear encoder, and supplies a driving force to the stage using a ball screw or an actuator, such as a linear motor, to control the stage position in accordance with positioning servo control or velocity servo control.

Figure 3A:
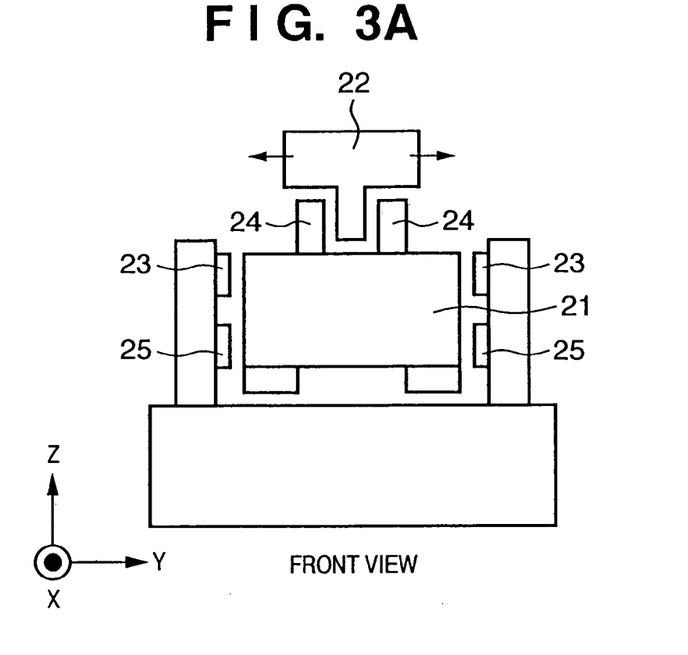
FIGS. 3A and 3B are views for explaining the principle as to how a force is generated along the other axes.
Figure 3B:
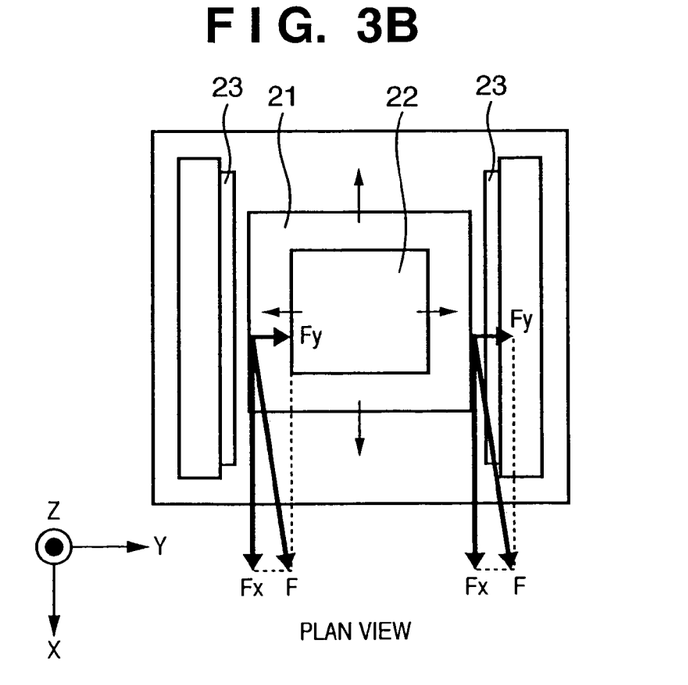

With the conventional positioning apparatus, however, when the stage is to be driven along a direction of one degree of freedom, the actuator can generate a thrust in a direction not parallel to the direction of the drive axis. In this case, an undesirable force is generated along other axes. FIGS. 3A and 3B are views for explaining the principle as to how the force is generated along the other axes. FIG. 3A is a front view, and FIG. 3B is a plan view. In the plan view of FIG. 3B, assume that the vertical direction on the drawing corresponds to the X-axis (which is positive downward), and that the horizontal direction on the drawing corresponds to the Y-axis (which is positive rightward). An X stage 21 can be driven in the X direction, and a Y stage 22 can be driven in the Y direction. The X stage 21 is driven by drive actuators 23 and restrained in the Y direction by X stage guides 25. Accordingly, the X stage 21 is driven in the X direction. The Y stage 22 is driven in the Y direction by a Y stage guide (not shown) arranged on the X stage 21.

Each drive actuator 23 generates a thrust F to drive the X stage 21. As shown in FIG. 3B, when the thrust F is inclined with respect to the X-axis, it has a Y-direction-component force. In this case, the thrust F is decomposed into a component Fx and a component Fy with respect to the X- and Y-axes, respectively. At this time, the force component Fy generated in the Y direction is input as a disturbance to the servo control system of the Y stage 22, which is restrained in the X direction by the X stage 21, and degrades the positioning accuracy of the Y stage 22.

Figure 4A:
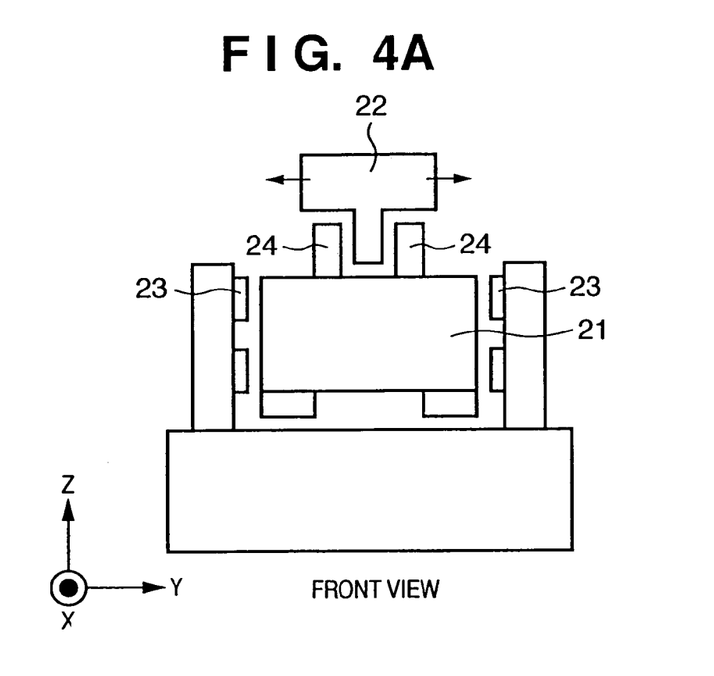
FIGS. 4A and 4B are views for explaining the principle as to how a force is generated along the other axes.
Figure 4B:
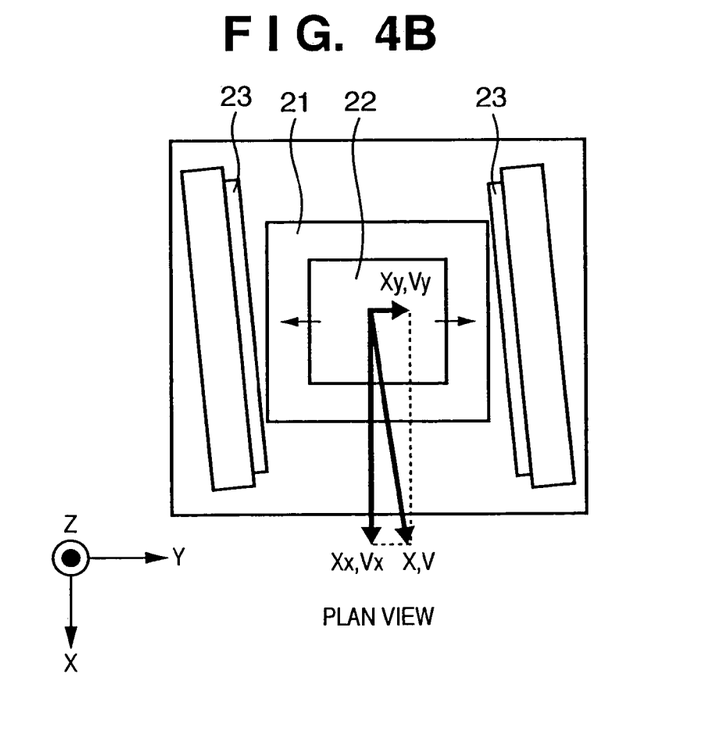

FIGS. 4A and 4B are another set of views for explaining the principle as to how the force is generated along the other axes. FIG. 4A is a front view, and FIG. 4B is a plan view. For example, as shown in FIG. 4B, when the drive actuators 23 are not parallel to the X-axis, a displacement X and velocity V generated when the X stage 21 is driven have Y-axis components as well as X-axis components. In this case, the displacement X is decomposed into Xx and Xy with respect to the X- and Y-axes, respectively, and the velocity V is decomposed into Vx and Vy with respect to the X- and Y-axes, respectively. The displacement Xy and velocity Vy generated in the Y-axis are input to the control system of the Y stage 22 as force disturbances by, e.g., the spring performance, damperness, or the like, of actuators 24, which bind the Y stage 22. Consequently, the positioning accuracy of the Y stage 22 is degraded.

SUMMARY OF THE INVENTION

The present invention has been made in view of the above problems, and has as its object to suppress a disturbance which is input to a control system of a second drive axis when a stage is driven along a first drive axis.

According to the first aspect of the present invention, there is provided a positioning apparatus comprising a stage, a first actuator which drives the stage along a first drive axis, a second actuator which drives the stage along a second drive axis, a detector which detects position information of the stage in a direction of the first and second drive axes, and a controller which controls the first and second actuators based on detection results of the detector, wherein the controller controls the second actuator based on the position information of the stage in the direction of the first drive axis, which is detected by the detector, so as to cancel a force which is generated in the direction of the second drive axis by the first actuator when the first actuator drives the stage in the direction of the first drive axis.

According to the second aspect of the present invention, there is provided an exposure apparatus comprising an optical system for transferring a pattern from an original to a substrate, and the positioning apparatus described above, which holds and positions the substrate or original.

According to the third aspect of the present invention, there is provided a semiconductor device manufacturing method comprising steps of exposing a substrate to a pattern, using the exposure apparatus described above, and developing the exposed substrate.

According to the present invention, a disturbance, which is to be input to a control system of a second drive axis when a stage is driven along a first drive axis, can be measured.

Other features and advantages of the present invention will be apparent from the following description taken in conjunction with the accompanying drawings, in which like reference characters designate the same or similar parts through the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE
PREFERRED EMBODIMENTS

First Embodiment

Figure 1:
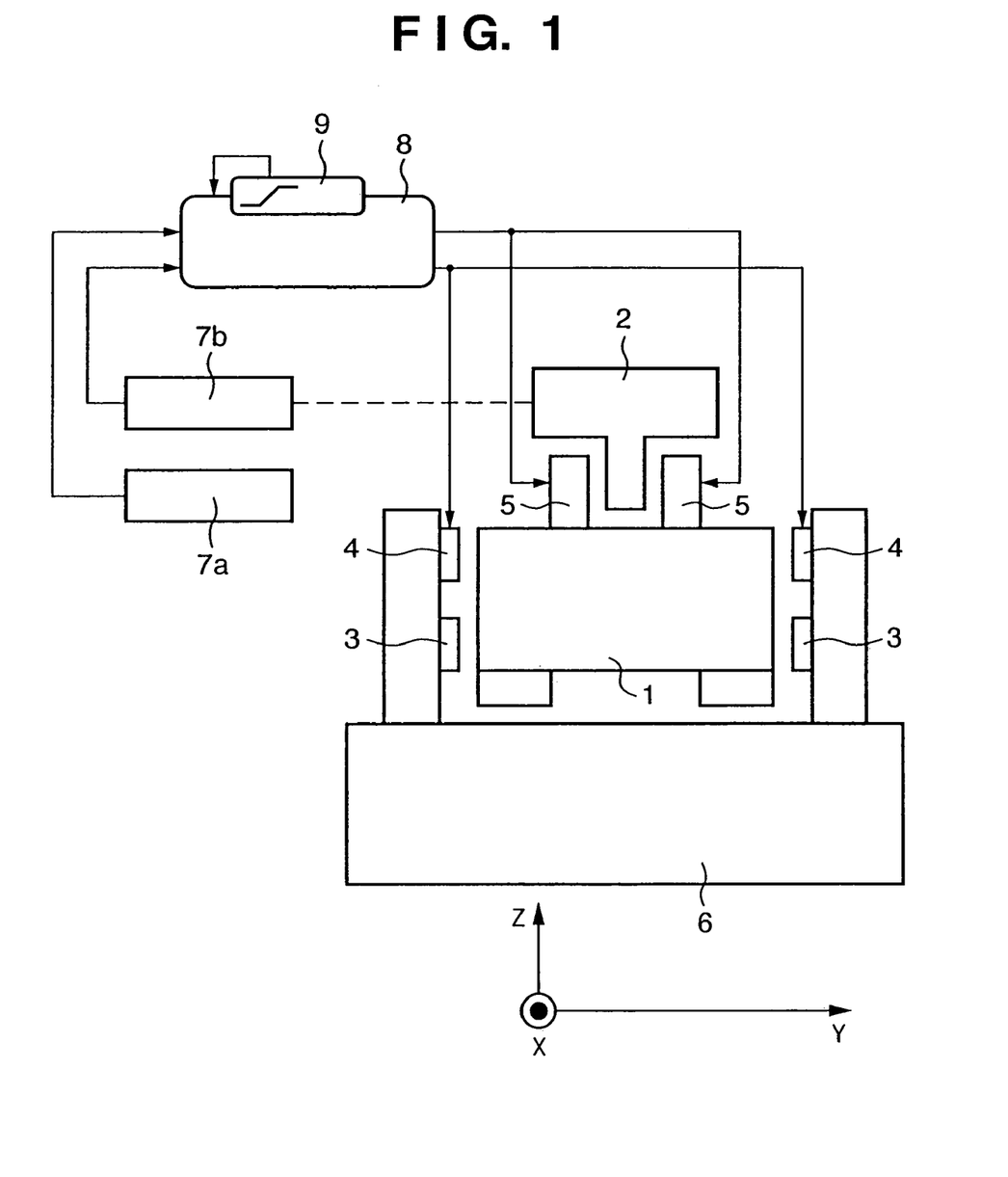
FIG. 1 is a view showing a positioning apparatus according to a preferred embodiment of the present invention.
Figure 2:
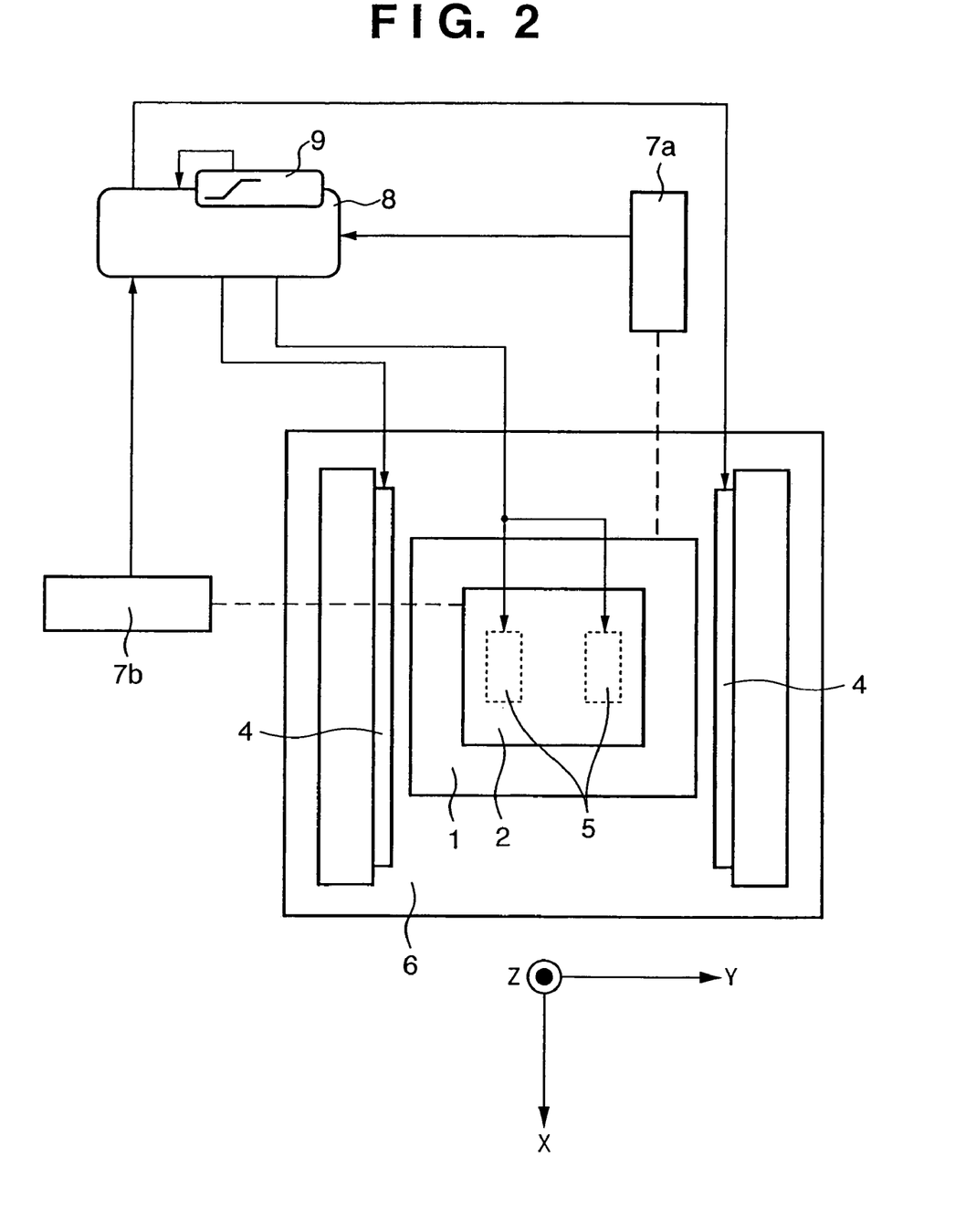
FIG. 2 is a view showing the positioning apparatus according to the preferred embodiment of the present invention shown in FIG. 1.

FIGS. 1 and 2 are views for explaining a positioning apparatus according to a preferred embodiment of the present invention. FIG. 1 is a front view, and FIG. 2 is a plan view. An axis in FIG. 1, which is positive toward the front side of the sheet of the drawing and an axis in FIG. 2, which is positive downward on the sheet of the drawing form the X-axis (first drive axis). In each of FIGS. 1 and 2, an axis, which is positive rightward is the Y-axis (second drive axis). An X stage 1 is arranged on a surface plate 6 in noncontact with it via hydrostatic bearings, electromagnets, or the like. The X stage 1 is restrained in the Y direction by hydrostatic bearings 3 and can be driven in the X direction. Linear motors 4 provide X-direction thrusts to the X stage 1 to drive it in the X direction. A Y stage 2 is arranged on the X stage 1 in noncontact with it via hydrostatic bearings, electromagnets, or the like, and can be driven in the Y-axis. Linear motors 5 provide Y-direction thrusts to the Y stage 2.

A laser interferometer 7a detects the position of the X stage 1 (see FIG. 2). A laser interferometer 7b detects the position of the Y stage 2. A controller 8 controls the respective elements of the positioning apparatus according to this embodiment. More specifically, the controller 8 calculates the values of the thrusts to be generated by the linear motors 4 and 5 based on control deviations between the position information of the X stage 1 and Y stage 2, which are obtained by the laser interferometers 7a and 7b and the target values of the X stage 1 and Y stage 2, and outputs target drive command values to drive the linear motors 4 and 5. In other words, the controller 8 controls the linear motors 5 based on the position information of the stages in the X direction, which are detected by the laser interferometers 7a and 7b, to cancel a force, which is generated in the Y direction when the linear motors 4 drive the X stage 1 in the X direction. A target value generator 9 generates the target values of the position information (e.g., position, velocity, and acceleration) on the X stage 1 and Y stage 2 and supplies them to the controller 8. The Y stage 2 is driven in the Y direction by a Y stage guide (not shown) arranged on the X stage 1.

For example, a digital arithmetic operation processor can be used as the controller 8. In this case, the controller 8 calculates a control deviation based on a digital value of the position information obtained by the laser interferometer 7a and the position target value generator 9. The control deviation is input to a control arithmetic operation unit, such as a filter, to obtain a target drive command value. The target drive command value is converted into an analog value by a digital-to-analog converter and then output to the linear motors 4 to perform a servo control arithmetic operation for the X stage 1. Similarly, concerning the Y stage 2, a target drive command value calculated based on the position information obtained by the laser interferometer 7b is output to the linear motors 5 to realize servo control.

Assuming that the position target value of the X stage 1 is changed to drive the X stage 1 in the X direction, due to the size tolerance, installation error, or the like, of the linear motors 4, if the thrust applied to the X stage 1 and the velocity and the acceleration of the X stage 1 are not completely parallel to the X-axis, they can be decomposed into X- and Y-direction components, respectively. The Y-direction component of the thrust is indirectly input to the Y-direction control system of the Y stage 2 as a disturbance. The Y-direction components of the velocity and acceleration are multiplied by the spring constant, damper coefficient, or the like, of the actuator or ambient gas, which provides the spring performances or damperness, and the obtained products are input to the Y-direction control system of the Y stage 2 as disturbances. The disturbances input to the Y-direction control system of the Y stage 2 are added to the target drive command value of the Y stage 2, thus degrading the positioning accuracy of the Y stage 2.

Figure 5:
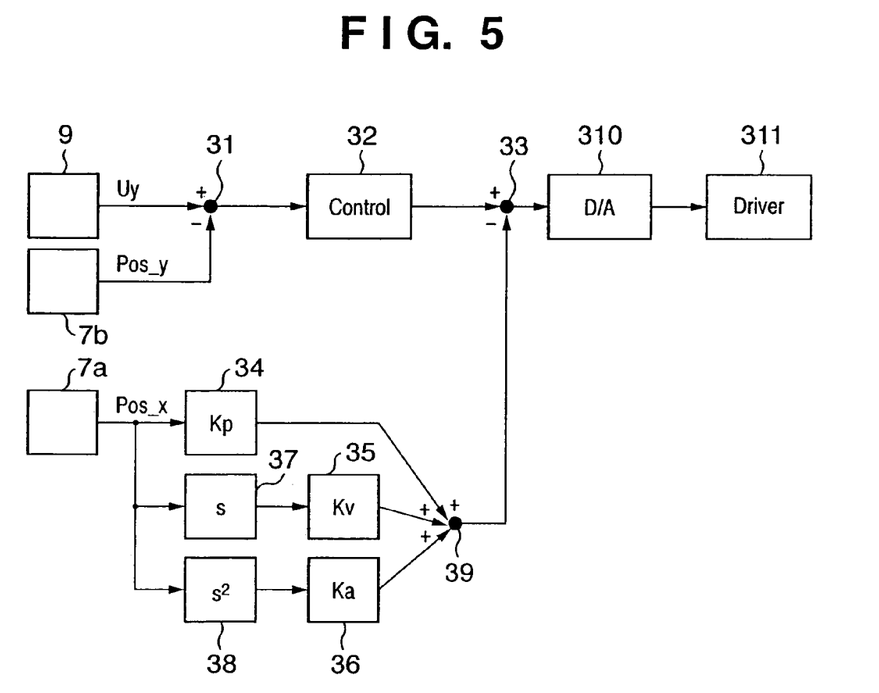
FIG. 5 is a block diagram of a control system of a controller for removing disturbances from a Y stage.

FIG. 5 is a block diagram of a control system of the controller 8 for removing the disturbances described above. A position target value Uy of the Y stage 2 is supplied from the target value generator 9. A position Pos_y of the Y stage 2 is obtained by the laser interferometer 7b. Uy and Pos_y are subjected to subtraction at an adding node 31 to obtain a control deviation (=Uy−Pos_y). The control deviation is input to a control arithmetic operation unit 32 to form a target drive command value. The target drive command value as an output from the control arithmetic operation unit 32 is converted into an analog value by a digital-to-analog converter 310 and input to a drive 311 of the linear motors 5 as a command value. As a result, a desired current flows to the linear motors 5 to generate a thrust in the Y stage 2.

A position Pos_x of the X stage 1 is obtained by the laser interferometer 7a. The position Pos_x of the X stage 1 is multiplied by a proportional gain Kp by a proportional element 34. Differential elements 37 and 38 calculate the first and second derivatives of the position Pos_x of the X stage 1, respectively. An output from the differential element 37 is multiplied by a proportional gain Kv by a proportional element 35 and multiplied by a proportional gain Ka by a proportional element 36. More specifically, the output from the differential element 37 becomes a value proportional to the velocity of the X stage 1, and an output from the differential element 38 becomes a value proportional to the acceleration and, furthermore, the thrust of the X stage 1. Then, outputs from the proportional element 34, differential element 37, and differential element 38 are added by an adding node 39. If the values of the proportional gains Kp, Kv, and Ka are optimal, an output from the adding node 39 becomes almost equal to the disturbances, which are input to the Y stage 2 when the X stage 1 is driven. Therefore, when the output value from the adding node 39 is subtracted from the target drive command value of the Y stage 2, which is output from the control arithmetic operation unit 32, the disturbances to be input to the control system of the Y stage 2 can be canceled.

Regarding the proportional gains Kp, Kv, and Ka, their optimal values are calculated in advance and stored in the processor of the controller 8. The optimal proportional gains Kp, Kv, and Ka are obtained in the following manner. The actual measurement values of the frequency characteristics between the X stage 1 and Y stage 2, which are obtained when a noise input is supplied to the X stage 1 are compared with the frequency characteristics between the X stage 1 and Y stage 2, which have a transfer function formed by the sum of the proportional gains and first and second derivative units and are obtained by an other axis interference simulator, and the proportional gains, which are set in the simulator and the gains of the first and second derivative units are adjusted. When the actual measurement values of the frequency characteristics coincide with the frequency characteristics obtained by the simulator, or when certain constant tolerance conditions are satisfied, the values of the proportional gains Kp, Kv, and Ka at this time can be determined as the optimal values.

Second Embodiment

A positioning apparatus according to the second preferred embodiment of the present invention will be described. The structure of the positioning apparatus of this embodiment is similar to that of the first embodiment and will, accordingly, be described with reference to FIG. 1. The principle as to how a disturbance is input to a Y stage 2 when an X stage 1 is driven is also similar to that of the first embodiment.

Figure 6:
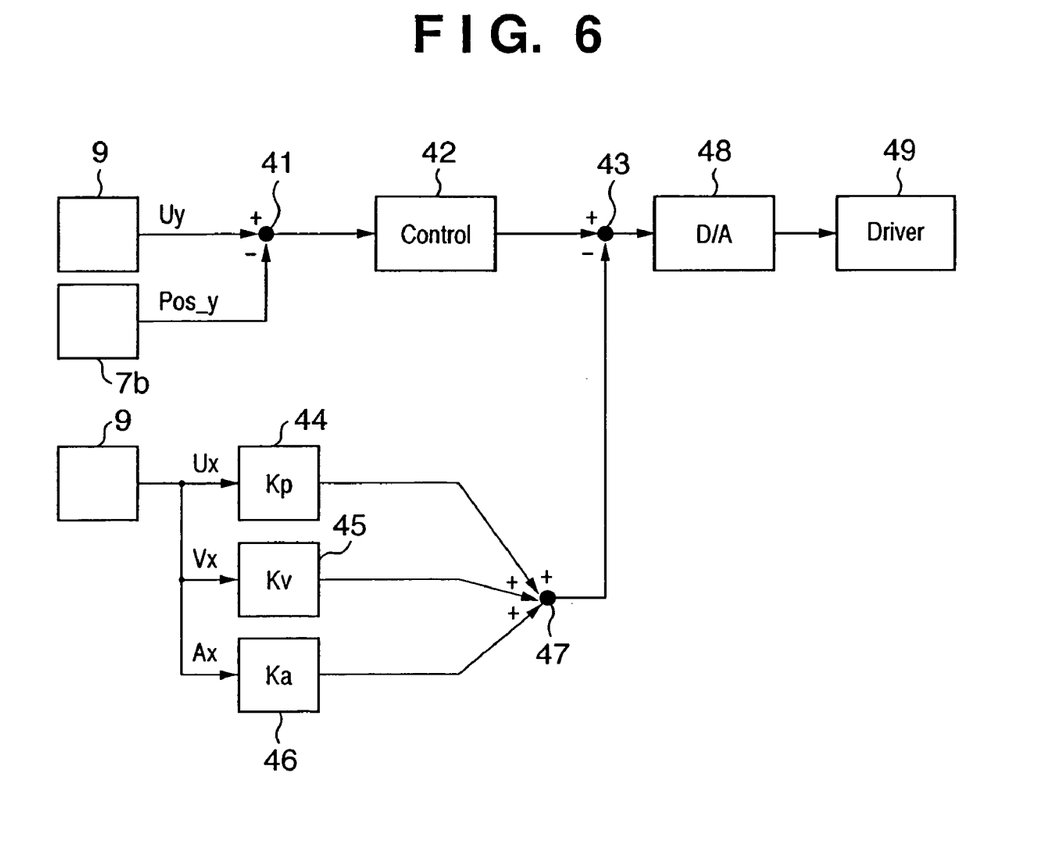
FIG. 6 is a block diagram of a control system of a controller for removing disturbances from the Y stage.

FIG. 6 is a block diagram of a control system of a controller 8 for removing the disturbances from the Y stage 2, which are input when the X stage 1 is driven. A position target value Uy of the Y stage 2 is supplied from a target value generator 9. A position Pos_y of the Y stage 2 is obtained by a laser interferometer 7b. Uy and Pos_y are subjected to subtraction at an adding node 41 to obtain a control deviation (=Uy−Pos_y). The adding node 41 outputs the control deviation to a controller 42. An output from the controller 42 serves as a target drive command value, which is converted into an analog signal by a digital-to-analog converter 48 and the input to a drive 49 of linear motors 5 as a command value. Consequently, a desired current flows to the linear motors 5 to generate a thrust in the Y stage 2.

In the second embodiment, the target value generator 9 generates a position target value Ux, velocity target value Vx, acceleration target value Ax, and the like, of the X stage 1 in advance, such that they can be used in forming a control target value, feed-forward value, and the like, in the servo control system of the X stage 1. Accordingly, the differential elements 37 and 38 of the first embodiment become unnecessary. Output values from the target value generator 9 are respectively multiplied by proportional gains Kp, Kv, and Ka by proportional elements 44, 45, and 46, and outputs from the proportional elements 44, 45, and 46 are added by an adding node 47. If the values of the proportional gains Kp, Kv, and Ka are optimal, an output from the adding node 47 becomes almost equal to the disturbances, which are input to the Y stage 2 when the X stage 1 is driven. When the output from the adding node 47 is subtracted at an adding node 43 from the target drive command value of the Y stage 2 output from the controller 42, the disturbance to be input to the control system of the Y stage 2 can be canceled.

Regarding the values of Kp, Kv, and Ka, their optimal values are calculated in advance and stored in the processor of the controller 8, in the same manner as in the first embodiment. More specifically, the frequency characteristics between the X stage 1 and Y stage 2, which are actually measured in an actual positioning apparatus are compared with the frequency characteristics between the X stage 1 and Y stage 2, which are simulated by a simulator, and the proportional gains which are set in the simulator and the gains of the first and second derivative units are adjusted. When the simulated frequency characteristics coincide with the frequency characteristics of the actual positioning machine, or when certain constant tolerance conditions are satisfied, the values of the proportional gains Kp, Kv, and Ka at this time may be employed.

In the first and second embodiments, laser interferometer systems are used as the laser interferometers 7a and 7b. However, the present invention is not limited to this. When another position detection apparatus, e.g., a distance measurement device, such as a linear encoder, is used, the same effect can be obtained.

In the first and second embodiments, a digital arithmetic operation processor is employed as a non-interference means. However, the present invention is not limited to this. When a differentiator, adder, amplifier, or the like, including an analog circuit is used, the same effect can be obtained.

As has been described above, according to the present invention, in a positioning apparatus, which has two or more degrees of freedom, when a disturbance is to be input to the control system of the second drive axis upon driving the stage along the first drive axis, the position, velocity, and acceleration of the positioning apparatus with respect to the first drive axis are multiplied by optimal gains, and the products are subtracted from the target drive command value of the second drive axis, such that the disturbance can be suppressed. As a result, the positioning performance of the positioning apparatus can be improved.

Application

Figure 7:
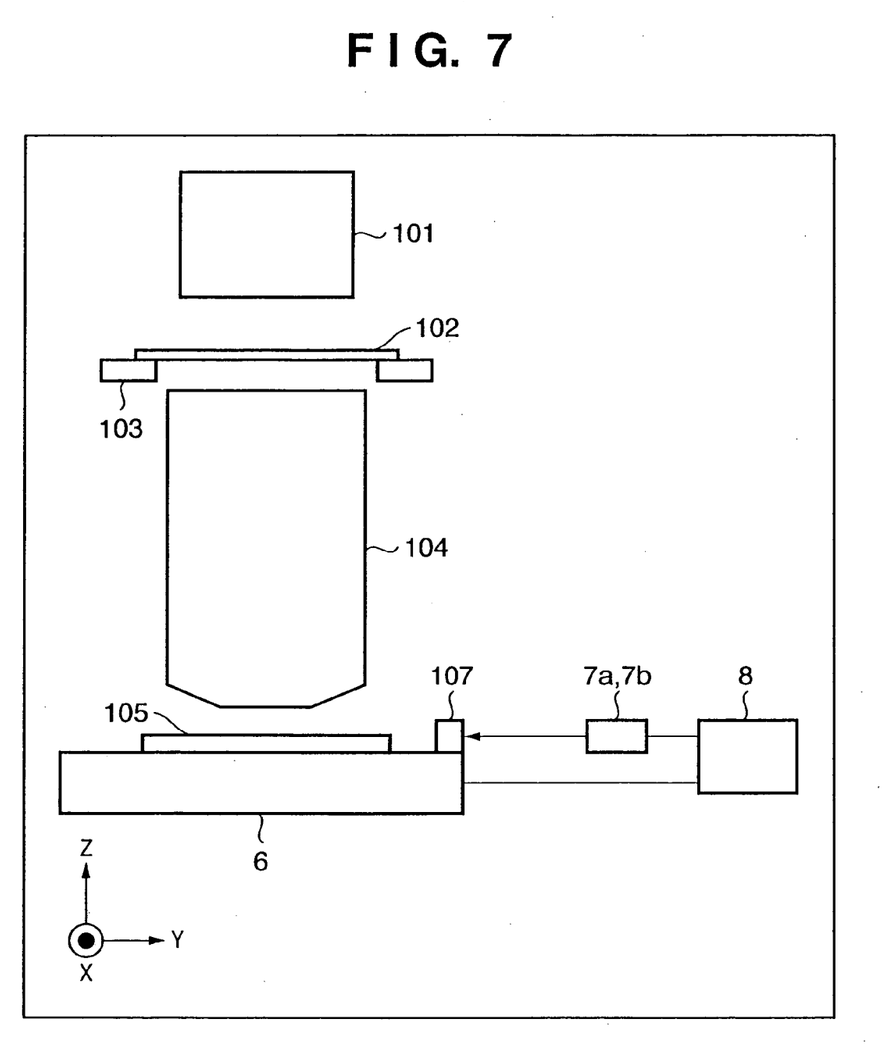
FIG. 7 is a view of an exposure apparatus to which a positioning apparatus according to the preferred embodiment of the present invention is applied.

FIG. 7 is a schematic view showing the structure of an exposure apparatus, which is obtained when a positioning apparatus according to the present invention is applied to an exposure apparatus used in a semiconductor device manufacturing process. Referring to FIG. 7, light emerging from an illumination optical system 101 irradiates a reticle 102 serving as an original. The reticle 102 is held on a reticle stage 103. The pattern of the reticle 102 is reduced and transferred by the magnification of a reduction projection lens 104. The image surface of the reduction projection lens 104 where a reticle pattern image is to be formed is perpendicular to the Z direction. A resist is applied to the surface of a substrate 105 as an exposure target sample, and shots formed in an exposure step are arranged on the resist. The substrate 105 as a controlled object is placed on a stage top plate 6. The stage top plate 6 has a chuck, which fixes the substrate 105, an X-Y stage, which serves as a drive unit horizontally movable in the X and Y directions, and the like. The position information of the stage top plate 6 is measured by laser interferometers 7a and 7b with respect to a mirror 107 fixed to the stage top plate 6. A controller 8 controls the stage top plate 6 based on a control deviation between a target value and the position information of the stage top plate 6, which is obtained by the laser interferometers 7a and 7b.

Figure 8:
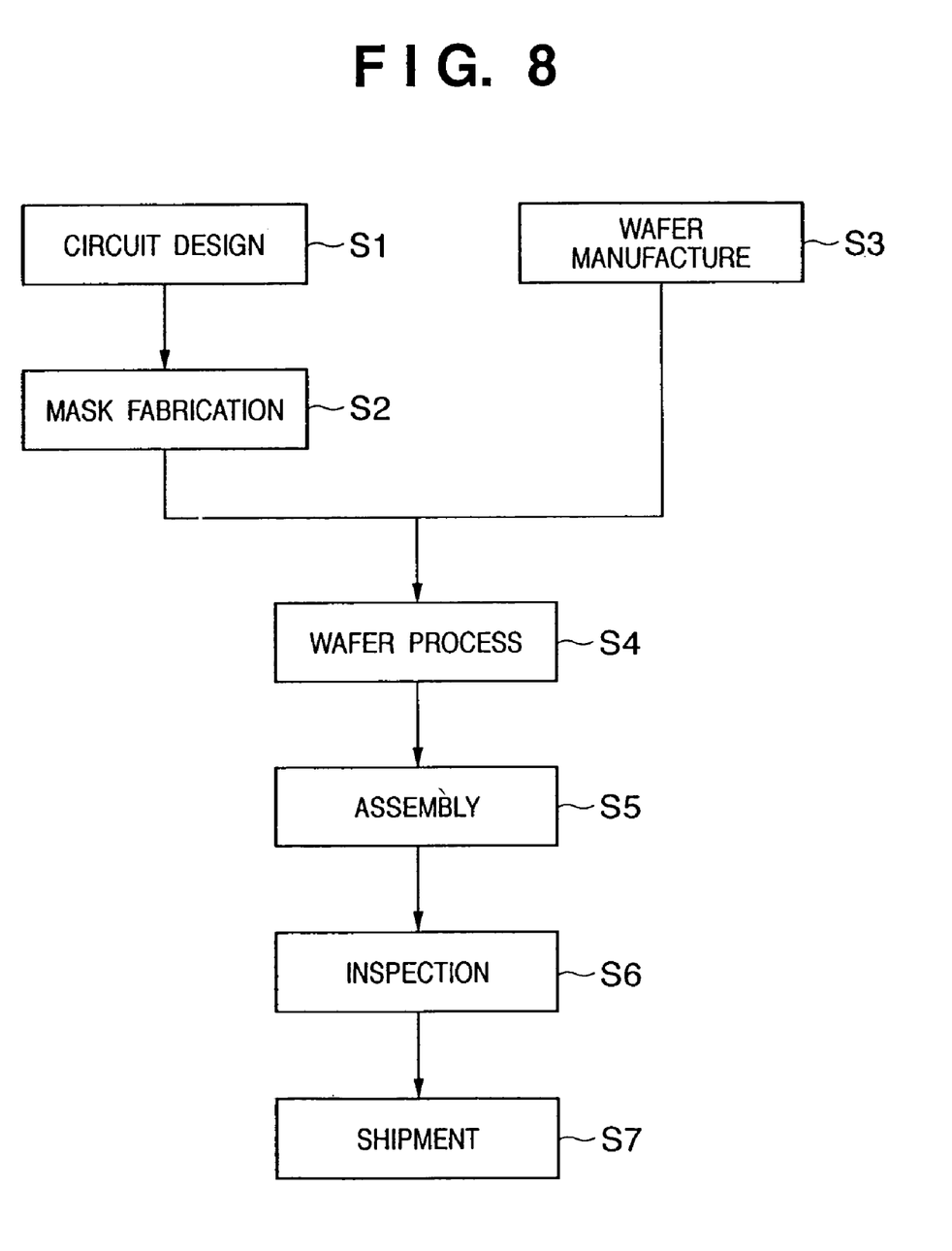
FIG. 8 is a flowchart showing the flow of an entire semiconductor device manufacturing process.

A semiconductor device manufacturing process using this exposure apparatus will be described. FIG. 8 is a flowchart showing the flow of the entire semiconductor device manufacturing process. In step 1 (circuit design), the circuit of a semiconductor device is designed. In step 2 (mask fabrication), a mask is fabricated based on the designed circuit pattern. In step 3 (wafer manufacture), a wafer is manufactured using a material such as silicon. In step 4 (wafer process), called a preprocess, an actual circuit is formed on the wafer by the exposure apparatus described above in accordance with lithography using the mask and wafer described above. In the next step, step 5 (assembly), called a post-process, a semiconductor chip is formed from the wafer fabricated in step 4. This step includes processes such as assembly (dicing and bonding) and packaging (chip encapsulation). In step 6 (inspection), inspections such as an operation check test and a durability test of the semiconductor device fabricated in step 6 are performed. A semiconductor device is finished with these steps and shipped in a step 7.

The wafer process of step 4 has the following steps, i.e., an oxidation step of oxidizing the surface of the wafer, a CVD step of forming an insulating film on the wafer surface, an electrode formation step of forming an electrode on the wafer by deposition, an ion implantation step of implanting ions in the wafer, a resist process step of applying a photosensitive agent to the wafer, an exposure step of transferring the circuit pattern form from the mask to the wafer after the resist process step by the exposure apparatus described above, a developing step of developing the wafer exposed in the exposure step, an etching step of removing portions other than the resist image developed in the developing step, and a resist removal step of removing unnecessary resist before etching. These steps are repeatedly performed to form multiple circuit patterns on the wafer.

As many apparently widely different embodiments of the present invention can be made without departing from the spirit and scope thereof, it is to be understood that the invention is not limited to the specific embodiments thereof except as defined in the claims.

What is claimed is:

1. A positioning apparatus comprising:
   a stage;
   a first actuator which drives said stage along a first drive axis;
   a second actuator which drives said stage along a second drive axis;
   a detector which detects position information of said stage in a direction of the first and second drive axes;
   a controller which controls said first and second actuators based on detection results of said detector,
   wherein said controller controls said second actuator based on the position information of said stage in the direction of the first drive axis detected by said detector, so as to cancel a force generated in the direction of the second drive axis by said first actuator when said first actuator drives said stage in the direction of the first drive axis, and
   wherein
   said controller comprises
   a first proportional element which multiples the position information obtained by said detector by a gain Kp,
   a first differential element which calculates first derivative of the position information obtained by said detector,
   a second differential element which calculates second derivative of the position information obtained by said detector,
   a second proportional element which multiplies an output from said first differential element by a gain Kv, and
   a third proportional element which multiplies an output from said second differential element by a gain Ka, and
   a sum of outputs from said first, second, and third proportional elements is subtracted from a target drive command value which is used for driving said second actuator.

2. A positioning apparatus comprising:
   a stage;
   a first actuator which drives said stage along a first drive axis;
   a second actuator which drives said stage along a second drive axis;
   a detector which detects position information of said stage in a direction of the first and second drive axes;
   a controller which controls said first and second actuators based on detection results of said detector,
   wherein said controller controls said second actuator based on the position information of said stage in the direction of the first drive axis detected by said detector, so as to cancel a force generated in the direction of the second drive axis by said first actuator when said first actuator drives said stage in the direction of the first drive axis, and
   wherein
   said controller comprises
   a first proportional element which multiplies an input position target value of said stage by a gain Kp,
   a second proportional element which multiplies an input velocity target value of said stage by a gain Kv, and
   a third proportional element which multiplies an input acceleration target value of said stage by a gain Ka, and
   a sum of outputs from said first, second, and third proportional elements is subtracted from a target drive command value which is used for driving said second actuator.

* * * * *